US012476193B2

(12) United States Patent
Long et al.

(10) Patent No.: US 12,476,193 B2
(45) Date of Patent: Nov. 18, 2025

(54) ROUTING A COMMUNICATION BUS WITHIN MULTIPLE LAYERS OF A PRINTED CIRCUIT BOARD

(71) Applicant: XILINX, INC., San Jose, CA (US)

(72) Inventors: Xi Long, San Jose, CA (US); Hing Yan To, Cupertino, CA (US)

(73) Assignee: XILINX, INC., San Jose, CA (US)

( * ) Notice: Subject to any disclaimer, the term of this patent is extended or adjusted under 35 U.S.C. 154(b) by 530 days.

(21) Appl. No.: 17/450,153

(22) Filed: Oct. 6, 2021

(65) Prior Publication Data

US 2023/0108962 A1 Apr. 6, 2023

(51) Int. Cl.
*H01L 23/538* (2006.01)
*H05K 1/11* (2006.01)
*H01L 25/065* (2023.01)
*H05K 1/18* (2006.01)

(52) U.S. Cl.
CPC ......... *H01L 23/5383* (2013.01); *H05K 1/116* (2013.01); *H01L 25/0655* (2013.01); *H05K 1/181* (2013.01); *H05K 2201/09627* (2013.01)

(58) Field of Classification Search
CPC ............. H01L 23/5383; H01L 25/0655; H01L 23/5384; H01L 25/18; H05K 1/116; H05K 1/181; H05K 2201/09627; H05K 1/0251
See application file for complete search history.

(56) References Cited

U.S. PATENT DOCUMENTS

| 5,027,253 | A | * | 6/1991 | Lauffer | .................. | H05K 1/162 |
| | | | | | | 29/25.42 |
| 5,719,750 | A | * | 2/1998 | Iwane | .................. | H05K 1/0237 |
| | | | | | | 361/780 |
| 5,741,729 | A | * | 4/1998 | Selna | ................ | H01L 23/49822 |
| | | | | | | 257/E23.079 |
| 5,787,260 | A | * | 7/1998 | Misaka | ............... | G06F 13/4086 |
| | | | | | | 710/100 |
| 6,064,113 | A | * | 5/2000 | Kirkman | ................. | H01L 24/49 |
| | | | | | | 257/691 |
| 6,104,258 | A | * | 8/2000 | Novak | ................. | H05K 1/0234 |
| | | | | | | 333/22 R |
| 6,225,690 | B1 | * | 5/2001 | Juneja | ............... | H01L 23/49822 |
| | | | | | | 257/664 |
| 6,229,095 | B1 | * | 5/2001 | Kobayashi | ........... | H05K 1/0216 |
| | | | | | | 174/262 |
| 6,441,653 | B1 | | 8/2002 | Spurlin | | |
| 6,515,868 | B1 | * | 2/2003 | Sasaki | .................. | H05K 1/0231 |
| | | | | | | 361/811 |

(Continued)

*Primary Examiner* — Bitew A Dinke
(74) *Attorney, Agent, or Firm* — Patterson + Sheridan, LLP

(57) ABSTRACT

A semiconductor device comprises a printed circuit board (PCB), a plurality of vias, and a communication buss. The PCB comprises a plurality of layers. The first layer of the plurality of layers is configured to receive a first integrated circuit (IC) device and a second IC device. The plurality of vias is disposed within the plurality of layers. A first via of the plurality of vias is configured to be connected to the first IC device, and a second via of the plurality of vias is configured to be connected to the second IC device. The communication bus comprises a first trace connected to the first via. The communication device further comprises a second trace disposed on a third layer of the plurality of layers and connected to the first via. The first trace is disposed on a layer of the plurality of layers other than the second layer.

18 Claims, 5 Drawing Sheets

(56) References Cited

U.S. PATENT DOCUMENTS

| | | | | |
|---|---|---|---|---|
| 6,521,843 B1* | 2/2003 | Kohya | H05K 1/0216 | 361/795 |
| 6,559,733 B2* | 5/2003 | Larson | H01P 1/268 | 333/32 |
| 7,023,719 B1* | 4/2006 | Hung | G11C 5/04 | 365/51 |
| 7,215,007 B2* | 5/2007 | McKinzie, III | H01P 1/2005 | 257/664 |
| 7,336,502 B1* | 2/2008 | Goergen | H05K 1/116 | 361/780 |
| 8,212,150 B2* | 7/2012 | Kim | H05K 1/0236 | 174/262 |
| 9,112,475 B2* | 8/2015 | Sasaki | H03H 7/0138 | |
| 9,986,651 B2* | 5/2018 | Mutnury | H05K 3/42 | |
| 10,292,257 B2 | 5/2019 | Anand et al. | | |
| 2002/0089798 A1* | 7/2002 | Iwanami | H05K 1/0233 | 361/32 |
| 2002/0134581 A1* | 9/2002 | Figueroa | H01L 23/642 | 257/532 |
| 2005/0240888 A1* | 10/2005 | Bacchus | H05K 1/024 | 257/500 |
| 2005/0263793 A1* | 12/2005 | Cornelius | H05K 1/0231 | 257/E23.079 |
| 2007/0030626 A1* | 2/2007 | Barnett | H05K 1/0233 | 257/E23.079 |
| 2007/0180420 A1* | 8/2007 | Bacchus | H05K 1/024 | 716/132 |
| 2009/0039984 A1* | 2/2009 | Kim | H01P 1/2005 | 333/212 |
| 2009/0045889 A1* | 2/2009 | Goergen | H05K 1/0216 | 174/266 |
| 2009/0296310 A1* | 12/2009 | Chikara | H01L 23/50 | 361/301.4 |
| 2009/0322450 A1* | 12/2009 | Kim | H05K 1/0236 | 333/204 |
| 2011/0220979 A1* | 9/2011 | Kawashima | H01L 23/50 | 257/296 |
| 2012/0106228 A1* | 5/2012 | Lee | G11C 7/1084 | 438/618 |
| 2013/0265726 A1* | 10/2013 | Murai | H05K 1/025 | 361/748 |
| 2014/0028412 A1* | 1/2014 | Sasaki | H03H 7/0138 | 333/185 |
| 2014/0301125 A1* | 10/2014 | Yoon | H05K 1/0253 | 174/262 |
| 2016/0133532 A1* | 5/2016 | Nishino | H05K 1/181 | 361/782 |
| 2017/0254968 A1* | 9/2017 | Ding | H01L 24/20 | |
| 2017/0309600 A1* | 10/2017 | Jung | H01L 23/49822 | |
| 2018/0158490 A1* | 6/2018 | Hovmoller | G11C 5/025 | |
| 2018/0295719 A1* | 10/2018 | Logan | H05K 1/0275 | |
| 2019/0103143 A1* | 4/2019 | Hasbun | G11C 11/2253 | |
| 2020/0187352 A1* | 6/2020 | Tan | H05K 1/115 | |
| 2020/0402547 A1* | 12/2020 | Sharma | G11C 7/109 | |
| 2021/0407915 A1* | 12/2021 | Contreras | H01L 25/0652 | |
| 2022/0005515 A1* | 1/2022 | Leslie | G11C 7/222 | |

* cited by examiner

ROUTING A COMMUNICATION BUS WITHIN MULTIPLE LAYERS OF A PRINTED CIRCUIT BOARD

TECHNICAL FIELD

Examples of the present disclosure generally relate to routing communication buses, and, more particularly, routing communication buses within multiple layers in a printed circuit board.

BACKGROUND

Communication buses transmit signals from driver devices to receiver devices. In many instances, a communication bus is routed within a single layer of a printed circuit board (PCB) of a semiconductor device and is connected to receiver devices through vias. As a signal travels along a communication bus and each via to each receiver device, reflections of the signal (e.g., ringing) may occur. Accordingly, a received signal may be negatively affected by the reflections and errors in the received signal. For example, a reflection of a signal may alter the voltage level of a received signal, introducing errors. In such an example, the receiver device may incorrectly identify the logic value of the received signal.

In some instances, to reduce reflections of the signal, the transmission rate may be decreased. In such instances, the driver device may control the slew rate of a transmitted signal, decreasing the transmission rate. However, decreasing the transmission rate, significantly limits the available transmission rates that may be used, and negatively limits the operation of the corresponding semiconductor device. In other instances, the unused portions of the via (e.g., the stubs) may be back-drilled. However, back-drilling increases manufacturing costs, complexity, and time, increasing the manufacturing costs, complexity, and time of the corresponding semiconductor device.

Accordingly, there is a need to mitigate reflections of a signal within a communication bus to mitigate errors in a received signal, and reduce manufacturing costs, complexity, and time of a semiconductor device.

SUMMARY

Communications buses communicate signals transmitted from a driver device to receiver devices. The communication bus is formed from two or more segments of traces connected to vias within a substrate of a semiconductor device. By varying the layers within the substrate on which the trace segments are disposed (e.g., patterned), reflections of the signal (e.g., ringing) are mitigated, reducing errors within a received signal. In one example, at least one segment of trace is disposed on a layer proximate the upper most layers and at least one segment of trace is disposed on a layer proximate the lower most layers. Accordingly, one or more layers are positioned between at least two segments of traces of the communication bus reducing the vertical via stub, mitigating inter-symbol interference of a signal transmitted along the communication bus.

In one example, a semiconductor device comprises a printed circuit board (PCB), a plurality of vias, and a communication buss. The PCB comprises a plurality of layers. The first layer of the plurality of layers is configured to receive a first integrated circuit (IC) device and a second IC device. The plurality of vias is disposed within the plurality of layers. A first via of the plurality of vias is configured to be connected to the first IC device, and a second via of the plurality of vias is configured to be connected to the second IC device. The communication bus comprises a first trace connected to the first via. The communication device further comprises a second trace disposed on a third layer of the plurality of layers and connected to the first via. The first trace is disposed on a layer of the plurality of layers other than the second layer.

In one example, PCB comprises a plurality of layers, a plurality of vias, and a communication bus. A first layer of the plurality of layers is configured receive a first integrated circuit (IC) device and a second IC device. The plurality of vias is disposed within the plurality of layers. A first via of the plurality of vias is configured to be connected to the first IC device, and a second via of the plurality of vias is configured to be connected to the second IC device. The communication bus comprises a first trace connected to the first via, and a second trace disposed on a third layer of the plurality of layers and connected to the first via. The first trace is disposed on a layer of the plurality of layers other than the second layer.

In one example, a semiconductor device comprises a PCB comprising a plurality of layers, a plurality of vias disposed within the plurality of layers, a first IC, a second IC, and a communication bus. The first IC device is mounted on a first layer of the plurality of layers and connected to a first via of the plurality of vias. The second IC device is mounted on the first layer and connected to the second via of the plurality of vias. The communication bus comprises a first trace connected to the first via, and a second trace disposed on a third layer of the plurality of layers and connected to the first via. The first trace is disposed on a layer of the plurality of layers other than the second layer. These and other aspects may be understood with reference to the following detailed description.

BRIEF DESCRIPTION OF THE DRAWINGS

So that the manner in which the above-recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

In a semiconductor device, a communication bus transmits signals (e.g., read signals, write signals, or other types of signals) to integrated circuit (IC) chips. The communication bus is connected to each IC chip through a respective via or vias within a printed circuit board (PCB). However, in many instances, ringing may occur due to unused portions of the vias. Ringing is due to the reflection of signals between IC chips. In one example, the vias may extend through each layer of a PCB. A communication bus includes traces that connect to the vias. An unused portion of a via is the portion of the via that is below where a trace connects to the via. For example, the unused portion of a via extends beyond the connection point with the trace to a bottom most layer of the PCB. These unused portions may be referred to as "stubs" and negatively affect signals that are communicated along a communication bus.

To mitigate ringing when communicating a control signal, the traces of the communication bus connect to the vias in different layers of the PCB. Accordingly, the amount of the vias that is used to communicate the control signal between IC chips is increased. For example, a first trace of the communication bus may connect to a first via proximate an upper most layer of the layers of the PCB and a second trace may connect to the first via proximate a lower most layer of the layers of the PCB. In such a configuration, one or more layers of the PCB is positioned between the first trace and second trace of the communication bus, increasing the amount of the via that is used to communicate the control signal between IC chips. Accordingly, the stubs are reduced, mitigating ringing and reducing errors within the control signals received by the IC chips. Further, a communication bus that is routed within multiple layers of a PCB facilitates the reliable use of higher transmission rates as compared to communication buses that are routed within a single layer of a PCB.

Figure 1A:
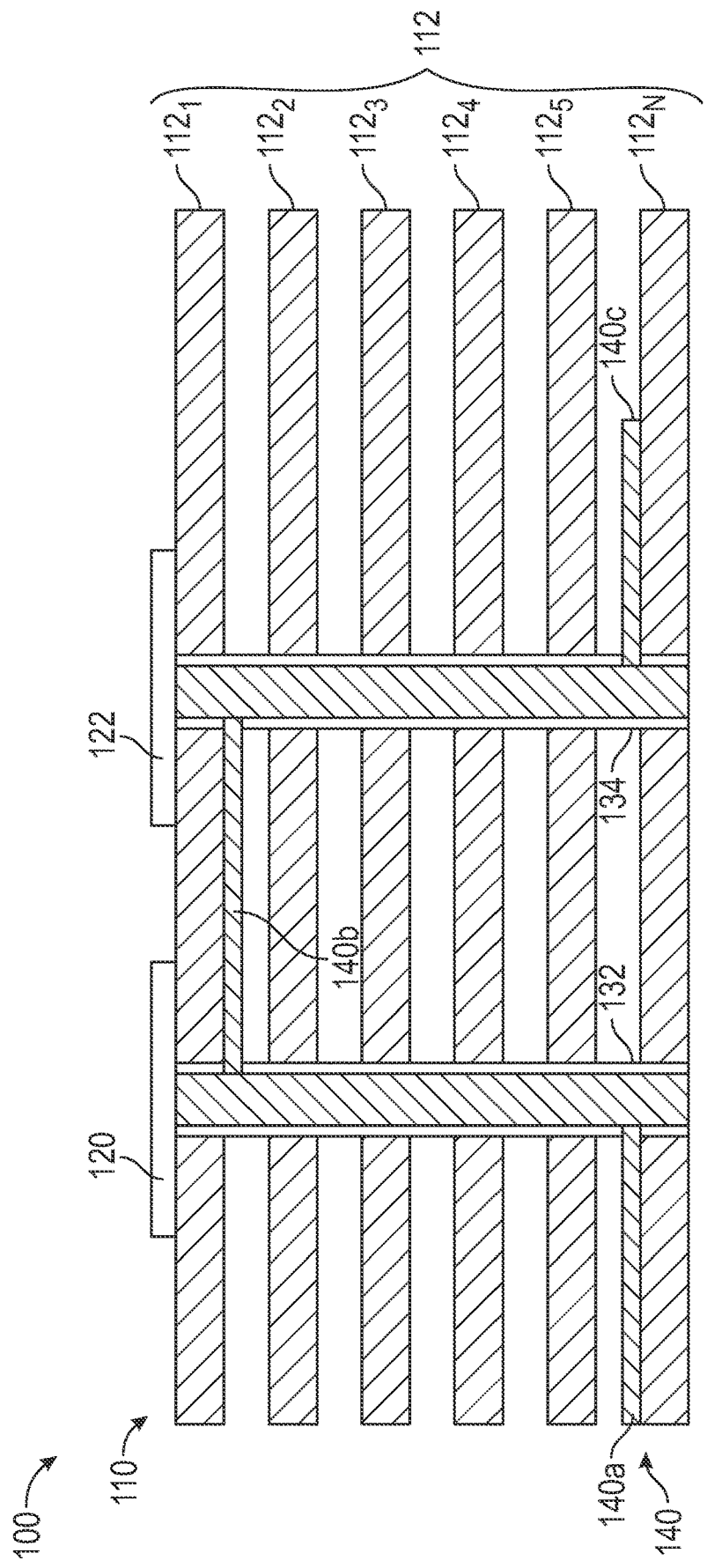
FIG. 1A is a partial schematic diagram of a semiconductor device, according to an example.

FIG. 1A illustrates semiconductor device 100, according to one or more examples. The semiconductor device 100 includes PCB 110. The semiconductor device 100 further includes one or more integrated circuit (IC) devices 120, 122.

The PCB 110 includes a plurality of layers 112. In the example of FIG. 1A, the PCB 110 includes layers $112_1$-$112_N$. N is two or more. In one example, N is 5 or more. While a PCB is described in the following, in other examples, similar techniques may be applied to other types of substrate devices that include multiple layers on which conductive materials may be disposed.

The layers 112 are insulating layers on which conductive layers may be patterned. The conductive layers may be referred to as metal layers. The conductive layers may be patterned on either side, or both sides, of each layer 112. In one example, each layer 112 is comprised of an FR-4 material, or another composite material. Each of the layers 112 may be referred to as a core layer. A dielectric material (not shown) separates each of the layers 112. In one or more examples, the conductive layers may be patterned to form a communication bus 140.

IC devices 120 and 122 are disposed (e.g., mounted) on the layer $112_1$ of the PCB 110. The IC devices 120 and 122 are IC chips and/or IC packages. In one example, the IC device 120 and/or 122 are logic devices such as field programmable gate arrays (FPGAs) or application specific ICs (ASICs), among others. In one example, the IC device 120 and/or 122 are receiver devices. The IC device 120 and/or 122 may be receiver devices for a memory system. For example, the IC device 120 and/or 122 is a dynamic random access memory (DRAM) receiver device. In other examples, the IC devices 120 and/or 122 is a receiver device for other types of memories or systems.

Figure 1B:
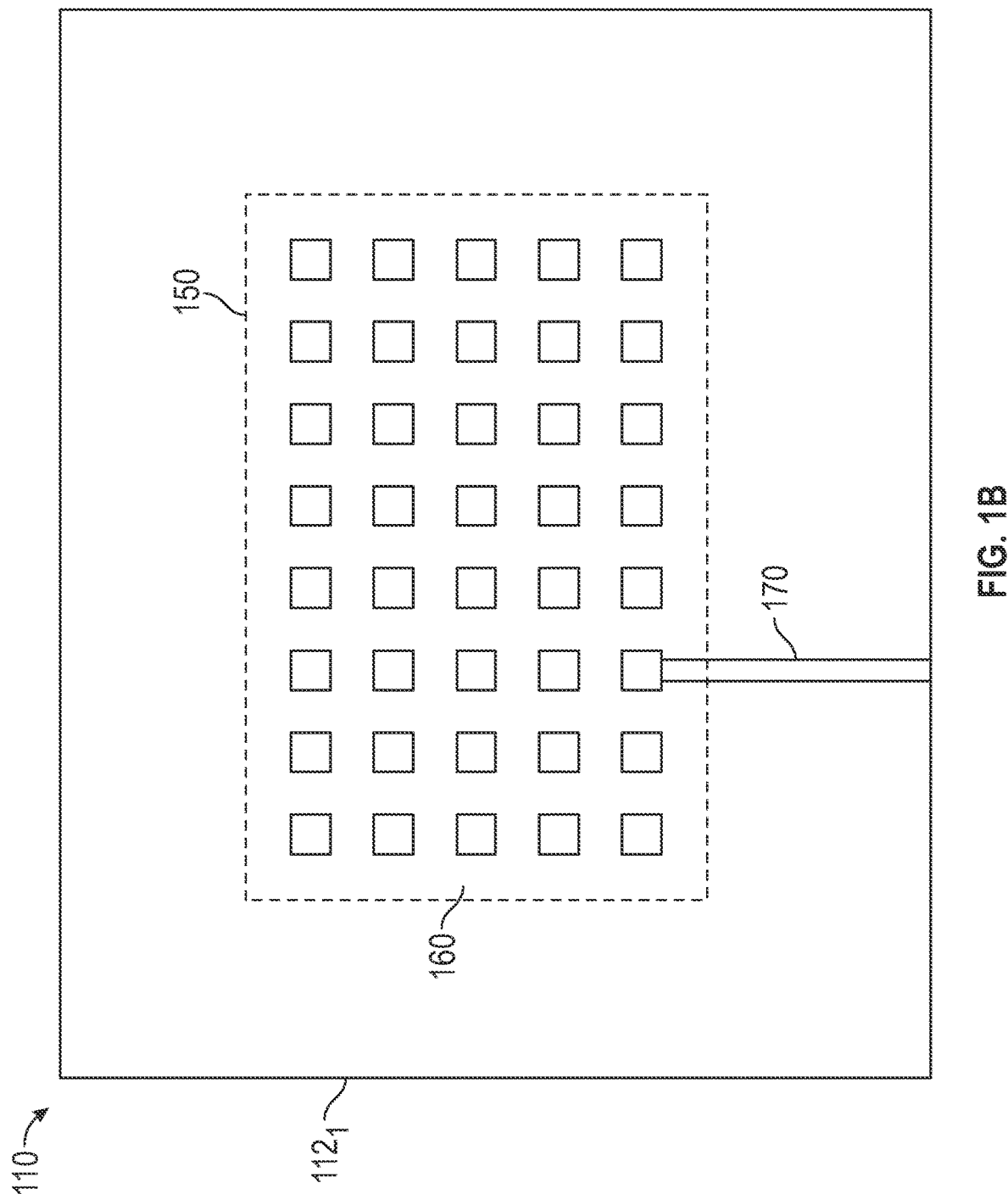
FIG. 1B is a partial schematic diagram of a top layer of a semiconductor device, according to an example.

The IC devices 120 and 122 include one or more connection elements (e.g., pins or bump pads) that are used to connect the IC devices 120 and 122 to the layer $112_1$. In one example, the connection elements of the IC devices 120 and/or 122 are connected to one more connection elements (e.g., bump pads or sockets) of the PCB 110. FIG. 1B illustrates a portion of the layer $112_1$ of the PCB 110. The layer $112_1$ includes IC device receiver area 150. The IC device receiver area 150 includes connection elements 160 (e.g., bump pads or sockets) that are configured to connect to connection elements on the IC device 120 and/or 122. The connection elements 160 are fabricated from a conductive material such as a metal. One of the connection elements 160 is connected to the trace 170. The trace 170 may be disposed on either side (e.g., a top surface or bottom surface) of the layer $112_1$. In one or more example, the trace 170 is fabricated from a conductive material such as a metal. In one or more examples, two or more of the connection elements are connected to a respective trace. While the FIG. 1B illustrates one IC device receiver area 150, in other examples, the layer $112_1$ may include multiple IC device receiver areas 150. In one example, each IC device 120 and 122 is mounted the connection elements 160 of a respective IC device receiver area 150.

The layer $112_1$ may be referred to as the uppermost layer (e.g., top layer) of the PCB 110. The layer $112_N$ may be referred to as the lower most layer (e.g., the bottom layer).

The IC devices 120 and 122 are connected to the vias 132 and 134 through the respective traces (e.g., the trace 170 of FIG. 1B). The vias 132 and 134 are disposed within the layers 112 of the PCB 110. The vias 132 and 134 include conductive elements and provide a conductive path to connect different metal layers within the PCB 110 to each other. In one example, the vias 132 and 134 are fabricated from a conductive material such as a metal. In one example, one or more of the vias 132 and 134 pass through each layer 112. In such an example, the vias span from the layer $112_1$ to the layer $112_N$. In other examples, one or more of the vias 132 and 134 pass through less than all of the layers 112.

The communication bus 140 is formed within the PCB 110 and communicatively, and electrically, connects the IC devices 120 and 122 to an external device or devices. For example, the communication bus 140 may be connected to an external driver device (e.g., FPGA, ASIC, central processing unit (CPU), or graphics processing unit (GPU), among others). The external driver device is disposed outside the semiconductor device 100. The communication bus 140 receives a signal from the external driver device and communicates the signal to the IC devices 120 and 122. In one example, the communication bus 140 includes one or more signal lines. Further, the communication bus 140 may be a fly-by bus or other type of communication bus. The communication bus 140 is fabricated from a conductive material, such as a metal.

The communication bus 140 includes traces 140a-140c. The traces 140a-140c are fabricated from a conductive material, such as a metal. The traces 140a and 140b are disposed on different ones of the layers 112. Accordingly, the communication bus 140 is formed on more than one of the layers 112. As illustrated in FIG. 1A, the trace 140a is disposed (e.g., patterned) on layer $112_N$ and the trace 140b is disposed on the layer $112_1$. In one example, the trace 140b is disposed on layer between the layer $112_N$ and the layer $112_1$. Further, the trace 140a is disposed on a layer between the layer $112_N$ and the layer on which the trace 140b is disposed. In various examples, one or more layers 112 is positioned between the layer on which the trace 140b is disposed and the layer on which the trace 140a is disposed. In one or more examples, the orientation of the traces 140a and 140b may be reversed such that the trace 140a is disposed on a layer closer to the layer $112_1$ than the layer on which the trace 140b is disposed.

The trace 140a is connected to the via 132. The trace 140b is connected to the vias 132 and 134, connecting the vias 132 and 134 to each other.

The trace 140c is disposed on the layer $112_N$. In such an example, the trace 140c is disposed on the same layer as the trace 140a. In other examples, the trace 140c is disposed on a layer between the layer $112_1$ and $112_N$. For example, the trace 140c may be disposed on one of layers $112_2$-$112_4$. The trace 140c is further connected to another via or a termination device.

In one example, varying the layers on which the traces 140a, 140b, and 140c are disposed increases the amount of the vias 132 and 134 that are used to communicate a signal to the IC devices 120 and 122 along the communication bus 140. Accordingly, reflections between the IC devices 120 and 122 are mitigated, allowing the communication bus 140 to support higher transmission rates and reducing errors within signals received by the IC devices 120 and 122.

Figure 2:
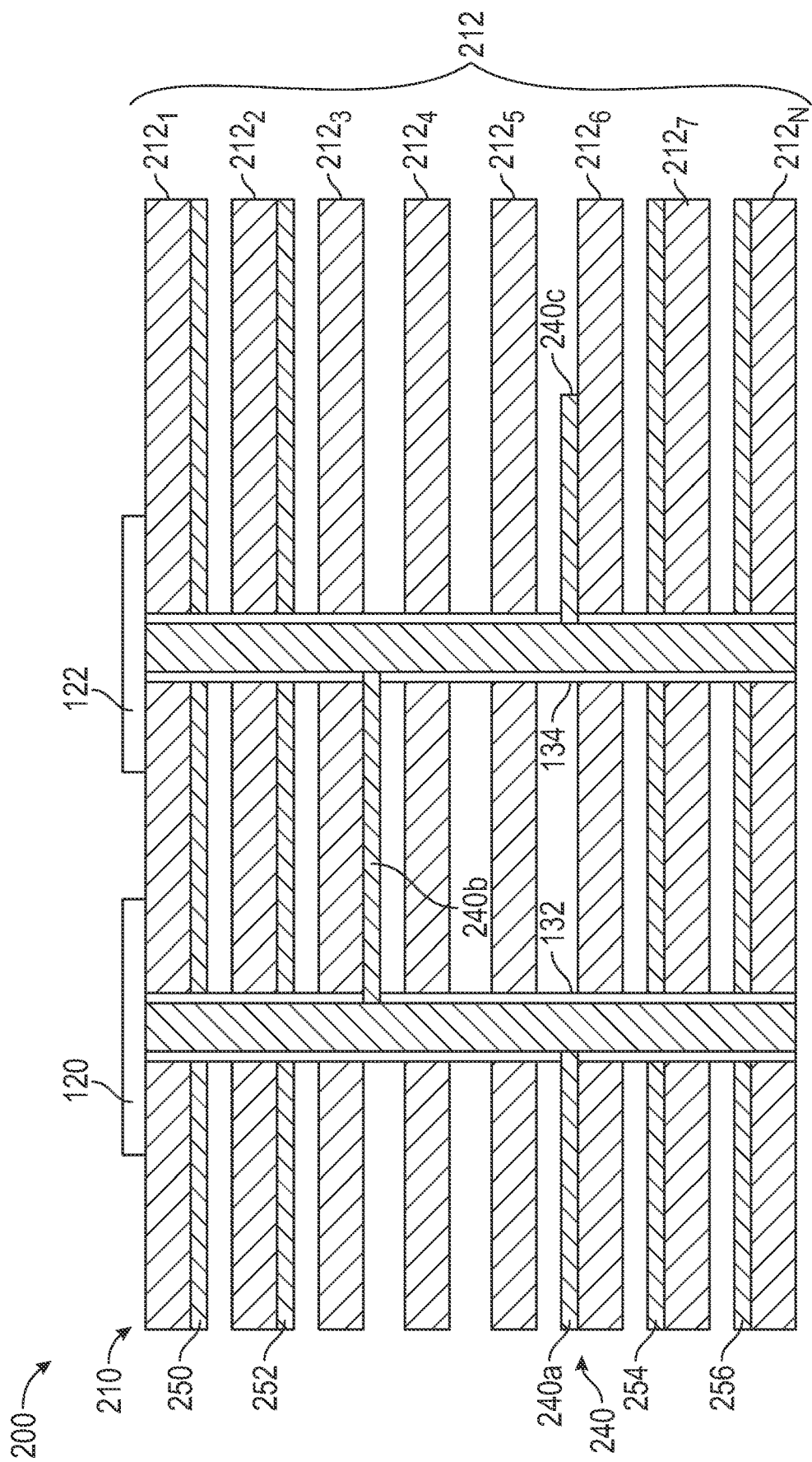
FIG. 2 is a partial schematic diagram of a semiconductor device, according to an example.

FIG. 2 illustrates a semiconductor device 200, according to one or more examples. The semiconductor device 200 is configured similar to that of the semiconductor device 100. The semiconductor device 200 includes a PCB 210 and IC devices 120 and 122.

The PCB 210 is configured similar to that of the PCB 110. For example, the PCB 210 comprises multiple layers 212 separated by a dielectric material (not shown). The PCB 210 includes a plurality of layers 212. For example, the PCB 210 includes layers $212_1$-$212_N$. In one example, N is 6 or more. As is described with regard to FIG. 1A, one or more conductive layers within the PCB 210 are patterned to form the communication bus 240.

In one example, one or more of the layers $212_1$ and $212_2$ is configured to route data signals. For example, a trace 250 and/or 252 disposed on the layers $212_1$ and $212_2$, respectively, is configured to route data signals. The traces 250 and 252 are fabricated from a conductive material, such as a metal. Further, one or more of the layers $212_7$ and $212_N$ is configured to route a reference voltage or voltages. For example, a trace 254 and/or 256 is disposed on the layer $212_7$ and $212_N$, respectively, and is configured to communicate a reference voltage. The reference voltage may be a ground voltage or another constant voltage signal (e.g., a direct current (DC) voltage).

As is noted above, one or more of the upper most layers 212 (e.g., the layers $212_1$ and/or $212_2$) is used for routing data signals (e.g., via the traces 250 and 252, respectively), and one or more of the lower most layers 212 (e.g., the layers $212_7$ and $212_N$) is used for routing a reference voltage. The upper most layer of the layers 212 is layer $212_1$. The layer $212_1$ may also be referred to as the top layer. The lower most layer of the layers 212 is the layer $212_N$. The layer $212_N$ may also be referred to as the bottom layer. In one or more examples, N is 8 or more.

Two or more of the layers 212 between the upper most layer (e.g., the layer $212_1$), and the lower most layer (e.g., the layer $212_N$) are used to route the communication bus 240. The communication bus 240 is connected to each of the IC devices 120 and 122. The communication bus 240 includes traces 240a, 240b, and 240c. As illustrated in FIG. 2, one or more of the traces 240a, 240b, and 240c is disposed on a layer 212 different from another one or more of the traces 240a, 240b, and 240c. For example, the trace 240a is disposed (e.g., patterned) on the layer $212_6$, the trace 240b is disposed on the layer $212_3$, and the trace 240c is disposed on the layer $212_6$. In the example of FIG. 2, the traces 240a and 240c are disposed on the same layer, however, in another example, the traces 240a and 240c are disposed on different layers 212. For example, the trace 240a is disposed on the layer $212_6$, and the trace 240c is disposed on a layer $212_5$, or a layer other than layer $212_6$.

In one example, one or more layers (e.g., the layer $212_4$ and/or $212_5$) is positioned between the layer $212_6$ on which the trace 240a is disposed and the layer $212_3$ on which the trace 240b is disposed. However, in other examples, two or more layers are positioned between the layer 212 on which the trace 240a is disposed and the layer 212 on which the trace 240b is disposed. In such examples, the trace 240c is disposed on the same layer as the trace 240a or another layer between the trace 240a and 240b such that each of the traces 240a, 240b, and 240c are disposed on different layers. In one example, the trace 240c is disposed on a layer between the layer on which the trace 240a is disposed and the bottom most layer $212_N$.

The traces 240a, 240b, and 240c may be disposed on either side of respective layers 212. In one example, traces disposed on the same layer (e.g., the traces 240a and 240c) are disposed on the same side of the respective layer or on different sides of the respective layer.

In the example of FIG. 2, the traces 240a and 240c are disposed on layers closer to the bottom most layer $212_N$ than that of the trace 240b. However, in other examples, the orientation of the traces 240a, 240b, and 240c is reversed such that one or more of the traces 240a and 240c is disposed on a layer closer to the upper most layer $212_1$ as compared to the trace 240b. In one example, the trace 240a and the trace 240c are disposed on the layer $212_3$ and the trace 240b is disposed on the layer $212_6$.

The traces 240a, 240b, and 240c form the communication bus 240. The trace 240a is connected to the via 132, the trace 240b connects the via 132 with the via 134, and the trace 240c is connected to the via 134. In one example, the trace 240c is further connected to another via or a termination device.

At least two of the traces 240a-240c of the communication bus 240 occupying different layers 212 of the PCB 210 mitigates reflections between the IC devices 120 and 124 when communicating a signal along the communication bus 240. The signal may be a control signal such as a read and/or write signal. Mitigating reflections reduces ringing within the communication bus 240. Accordingly, the communication bus 240 may support transmission rates higher than communication buses that do not include traces on multiple different layers.

Figure 3:
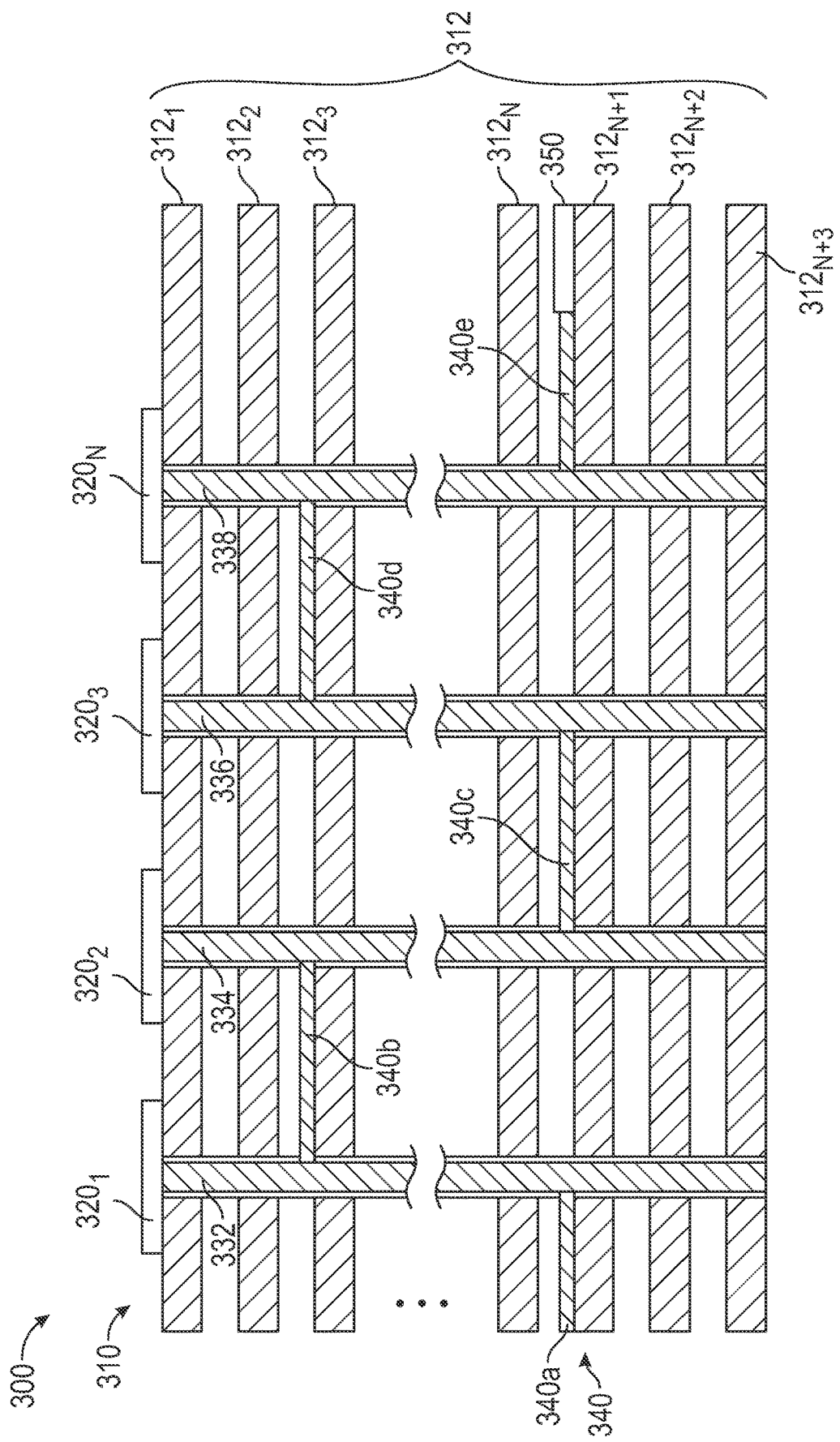
FIG. 3 is a partial schematic diagram of a semiconductor device, according to an example.

FIG. 3 illustrates the semiconductor device 300, according to one or more examples. For example, the semiconductor device 300 includes IC devices 320 and substrate 310. The substrate 310 includes layers 312 and is configured similar to that of the PCBs 110 and 210. The substrate includes layers $312_1$-$312_{N+3}$. The layers 312 are configured similar to that of the layers 112 and 212.

The IC devices 320 are mounted on the layer $312_1$ of the substrate 310. The layer $312_1$ is the uppermost layer (e.g., the top layer) of the layers 312. The IC devices 320 are configured similar to IC devices 120 and 122 of FIGS. 1 and 2. The IC devices 320 includes IC devices $320_1$ through $320_N$, where N is three or more. In other examples, N is two or more. Each of the IC devices 320 is connected to a respective trace disposed on the layer $312_1$. Each of the traces is connected to a respective via 332, 334, 336, and 338. Accordingly, each IC device 320 is connected to a respective via 332, 334, 336, and 338, with a respective trace. The vias 332, 334, 336, and 338 are configured similar to that of the vias 132 and 134.

The communication bus 340 includes the traces 340a-340e. The communication bus 340 is configured similar to that of the communication bus 140 and 240. One or more of the traces 340a-340e is disposed on a layer 312 different than another one or more of the traces 340a-340e. In one example, two or more of the traces 340a-340e are disposed on the same layer 312. Further, the traces 340a-340e may be disposed on one side of each respective layer 312, or both sides of the layers 312.

As illustrated in FIG. 3, the traces 340a, 340c, and 340e are disposed on the layer $312_{N+1}$. The traces 340a, 340c, and 340e may be disposed on one side or both sides of the layer $312_{N+1}$. The traces 340b and 340d are disposed on the layer $312_3$. The traces 340b and 340d may be disposed on one side or both sides of the layer $312_3$. In one example, one or more layers 312 is disposed between the layers $312_3$ and $312_{N+1}$. For example, the one or more layers $312_N$ is disposed between the layers $312_3$ and $312_{N+1}$. N is 4 or more.

The traces 340a is connected to the via 332 and the trace 340b is connected to the vias 332 and 334, connecting the vias 332 and 334 to each other. The trace 340c is connected to the vias 334 and 336, connecting the vias to each other. The trace 340d is connected to the vias 336 and 338, connecting the vias to each other. The trace 340e is connected to the via 338 and the termination device 350. The termination device 350 is a resistor. In one example, the termination device 350 is disposed on the same layer as the trace 340e. In another example, the termination device 350 is disposed on a layer different from the layer on which the trace 340e is disposed. For example, the termination device 350 is disposed on the layer $312_1$ or another layer between the layer $312_{N+1}$ and the layer $312_1$.

In one example, one or more of the traces 340a, 340c and 340e is disposed on a different layer than another one or more of the traces 340a, 340c, and 340e. For example, the trace 340c is disposed on the layer $312_N$ and the layer 340a and/or 340e are disposed on the layer $312_{N+1}$. Further, the traces 340b and 340d may be disposed on different layers 312. For example, the trace 340b may be disposed on the layer $312_3$ and the trace 340d may be disposed on a layer between the layer $312_3$ and a layer on which on which one or more of the traces 340a, 340c, and 340e is disposed. In one example, the trace 340d is disposed on a layer 312 that is between the layers 312 on which traces 340c and 340e are disposed. Further, in other examples, each of the traces 340a-340e may be disposed on a different layer 312.

Figure 4:
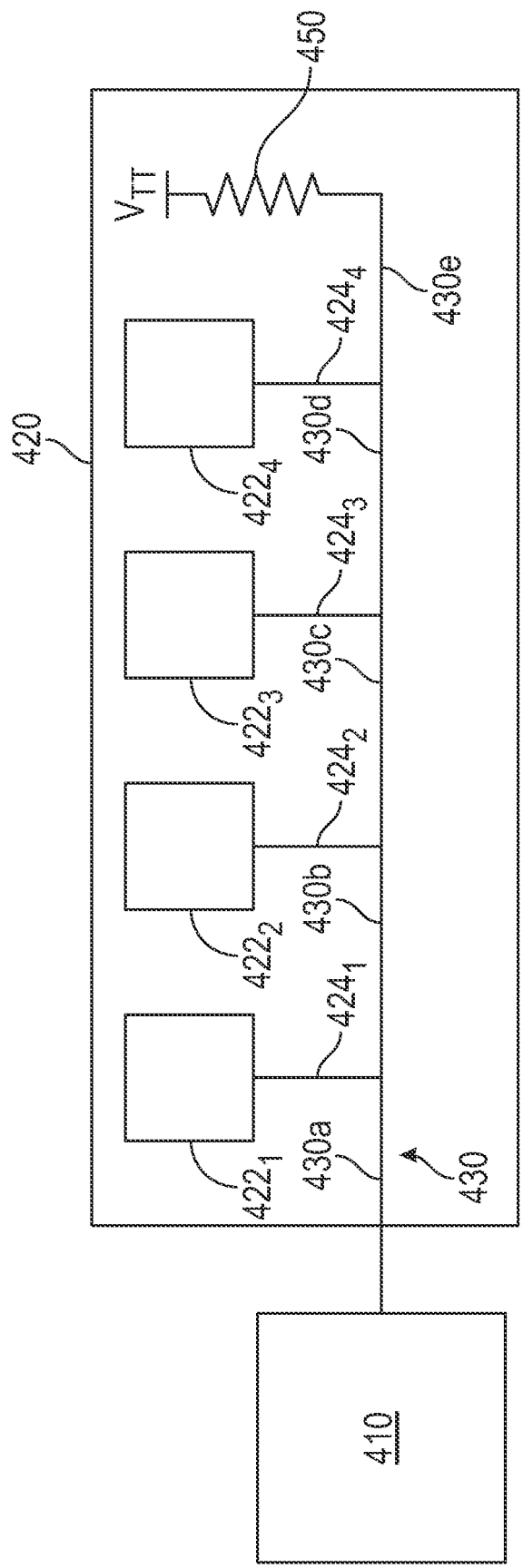
FIG. 4 is a block diagram of an example driver device and semiconductor device, according to an example.

FIG. 4 is a block diagram of a driver device 410 connected to a semiconductor device 420, according to one or more embodiments. The driver device 410 is processing device such as a FPGA, ASIC, CPU, or GPU, among others. The driver device 410 is electrically and communicatively connected to the semiconductor device 420 via communication bus 430.

The communication bus 430 is configured similar to that of the communication buses 140, 240, and/or 340 of FIGS. 1A, 2, and 3, respectively. In one example, the communication bus 430 is a directional bus or a fly-by bus. The communication bus 430 includes traces 430a, 430b, 430c, 430d, and 430e, which are connected to the vias $424_1$, $424_2$, $424_3$, and $424_4$. The vias $424_1$, $424_2$, $424_3$, and $424_4$ are configured similar to that of the vias 132 and 134 of FIGS. 1 and 2 or vias 332-338 of FIG. 3. The traces 430a, 430b, 430c, 430d, and 430e are configured similar to that of the traces 140a-140c of FIG. 1A, the traces 240a-240c of FIG. 2, and/or the traces 340a-340e of FIG. 3.

The driver device 410 transmits read and/or write signals (e.g., a control signal) via the communication bus 430 to each of the IC devices 422. The IC devices 422 are configured similar to that of the IC devices 120 and 122 of FIG. 1A or the IC devices 320 of FIG. 3. Each of the IC devices 422 functions as a load and receives the signals transmitted from the driver device 410 via the communication bus 430. In one example, each of the IC devices 422 is a receiver device. For example, the IC devices 422 are receiver devices for memory devices (e.g., DRAM or other memory types) or other devices.

As a signal travels along the communication bus 430 to each of the IC devices 422, the signal travels along each of the traces 430a-430d, and to the termination device 450 via the trace 430e. In one example, each of the IC devices 422 receives the signal and determines if the signal represents a value of logic 1 or a value of logic 0 based on a comparison of the voltage value of the signal to a threshold value or values. For example, based on a determination that the voltage value of the signal exceeds a first threshold value, a logic 1 is determined, and, based on a determination that the voltage value is less than a second threshold value, a logic 0 is determined. The first threshold voltage is greater than the second threshold voltage. However, in some instances, as the signal travels through each of the traces 430a-430e, and the vias 424, discontinuities may occur. The discontinuities may correspond to unused portions (e.g., stubs) of the vias 424. The discontinuities generate reflections, e.g., ringing, along the communication bus 430. For example, a portion of a signal may be reflected from the via 338 and along the trace 430d to the IC device $422_3$. The reflected signal increases the voltage value of the signal received at the IC device $422_3$, which may increase the voltage value of the signal above the second threshold value. Accordingly, the IC device $422_3$ may fail to detect a logic value of 0 in instances where the signal is transmitted with a voltage value below the second threshold value, and indicative a value of logic 0. However, by varying the position of the traces 430a-430e as described in FIGS. 1A-3, signal reflections, and ringing, are mitigated, reducing errors within the received signal. Accordingly, higher transmission rates may be used when transmitting signals along the signal path 430 as compared to signal paths that do not varying the position of the traces as described in FIGS. 1A-3.

As is discussed in the above disclosure, a communication bus that includes traces disposed on different layers within a PCB mitigates ringing within the communication bus. Mitigating ringing within the communication bus reduces reflections between IC chips connected to the communication bus. Accordingly, errors within signals received at the IC chips are reduced. Further, the transmission rate of the communication bus may be increased as compared to communication buses that do not have traces on different layers within a substrate.

While the foregoing is directed to specific examples, other and further examples may be devised without departing from the basic scope thereof, and the scope thereof is determined by the claims that follow.

What is claimed is:
1. A semiconductor device comprising:
   a printed circuit board (PCB) comprising a plurality of layers, wherein a first layer of the plurality of layers is configured to receive a first integrated circuit (IC) device and a second IC device;

a data signal trace disposed on a second layer of the plurality of layers and configured to route data signals;

a plurality of vias disposed within the plurality of layers, a first via of the plurality of vias configured to be connected to the first IC device, and a second via of the plurality of vias configured to be connected to the second IC device;

a communication bus forming a continuous electrical signal path, the communication bus comprising:
  a first trace disposed on a fourth layer of the plurality of layers and connected to a driver device and the first via;
  a second trace disposed on a third layer of the plurality of layers and connected to the first via and the second via, wherein one or more layers of the plurality of layers is disposed between the third layer and the fourth layer; and
  a third trace connected to the second via and a third via of the plurality of vias, and disposed on the fourth layer, wherein the driver device is configured to communicate control signals to the first IC device and the second IC device via the first trace, the second trace, the first via, and the second via of the communication bus; and a reference voltage trace disposed on a fifth layer of the plurality of layers and configured to route a voltage signal, wherein the data signal trace and the reference voltage trace are not electrically connected to the first via and the second via, and the third layer and fourth layer are disposed between the second layer and the fifth layer.

2. The semiconductor device of claim 1, wherein the third layer is positioned between the first layer and the fifth layer.

3. The semiconductor device of claim 2, wherein the third layer is between the second layer and the fourth layer.

4. The semiconductor device of claim 1, and wherein the communication bus further comprises a fourth trace disposed on the third layer and coupled to the third via and a termination device, wherein the termination device is disposed on the third layer.

5. The semiconductor device of claim 1, wherein:
  the first layer is further configured to receive a third IC device; and
  the third via is configured to be connected to the third IC device.

6. The semiconductor device of claim 5, wherein
  the first layer is further configured to receive a fourth IC device;
  a fourth via of the plurality of vias is configured to be connected to the fourth IC device; and
  the communication bus further comprises a fourth trace connected to the third via and the fourth via and disposed on the third layer.

7. The semiconductor device of claim 6, wherein the communication bus further comprises a fifth trace disposed on the fourth layer and connected to the fourth via and a termination device disposed on the fourth layer.

8. The semiconductor device of claim 1, wherein the first trace is physically connected to the first via, the second trace is physically connected to the first via and the second via, and the third trace is physically connected to the second via and the third via.

9. A printed circuit board (PCB) comprising:
  a plurality of layers, a first layer of the plurality of layers configured receive a first integrated circuit (IC) device and a second IC device;
  a data signal trace disposed on a second layer of the plurality of layers and configured to route data signals;
  a plurality of vias disposed within the plurality of layers, wherein a first via of the plurality of vias is configured to be connected to the first IC device, and a second via of the plurality of vias is configured to be connected to the second IC device;
  a communication bus forming a continuous electrical signal path, the communication bus comprising:
    a first trace disposed on a fourth layer of the plurality of layers and connected to a driver device and the first via;
    a second trace disposed on a third layer of the plurality of layers and connected to the first via and the second via, wherein one or more layers of the plurality of layers is disposed between the third layer and the fourth layer; and
    a third trace connected to the second via and a third via of the plurality of vias and disposed on the fourth layer, wherein the driver device is configured to communicate control signals to the first IC device and the second IC device via the first trace, the second trace, the first via, and the second via of the communication bus; and
  a reference voltage trace disposed on a fifth layer of the plurality of layers and configured to route a voltage signal, wherein the data signal trace and the reference voltage trace are not electrically connected to the first via and the second via, and the third layer and fourth layer are disposed between the second layer and the fifth layer.

10. The PCB of claim 9, wherein the third layer is positioned between the first layer and the fifth layer.

11. The PCB of claim 9, wherein the communication bus further comprises a fourth trace disposed on the third layer and coupled to the third via and a termination device, wherein the termination device is disposed on the third layer.

12. The PCB of claim 9, wherein:
  the first layer is further configured to receive a third IC device; and
  the third via is configured to be connected to the third IC device.

13. The PCB of claim 12, wherein
  the first layer is further configured to receive a fourth IC device;
  a fourth via of the plurality of vias is configured to be connected to the fourth IC device; and
  the communication bus further comprises:
    a fourth trace connected to the third via and the fourth via and disposed on the third layer; and
    a fifth trace disposed on the fourth layer and connected to the fourth via and a termination device disposed on the fourth layer.

14. The PCB of claim 9, wherein the first trace is physically connected to the first via, the second trace is physically connected to the first via and the second via, and the third trace is physically connected to the second via and the third via.

15. A semiconductor device comprising:
  a printed circuit board (PCB) comprising a plurality of layers;
  a plurality of vias disposed within the plurality of layers;
  a first integrated (IC) device mounted on a first layer of the plurality of layers and connected to a first via of the plurality of vias;
  a second IC device mounted on the first layer and connected to a second via of the plurality of vias;

a data signal trace disposed on a second layer of the plurality of layers and configured to route data signals; and a communication bus forming a continuous electrical signal path, the communication bus comprising:
  a first trace disposed on a fourth layer of the plurality of layers and connected to a driver device and the first via;
  a second trace disposed on a third layer of the plurality of layers and connected to the first via and the second via, wherein one or more layers of the plurality of layers is disposed between the third layer and the fourth layer; and
  a third trace connected to the second via and a third via of the plurality of vias, and disposed on the fourth layer, wherein the driver device is configured to communicate control signals to the first IC device and the second IC device via the first trace, the second trace, the first via, and the second via of the communication bus; and a reference voltage trace disposed on a fifth layer of the plurality of layers and configured to route a voltage signal, wherein the data signal trace and the reference voltage trace are not electrically connected to the first via and the second via, and the third layer and fourth layer are disposed between the second layer and the fifth layer.

16. The semiconductor device of claim 15, wherein the third layer of the plurality of layers is positioned between the first layer and the fifth layer.

17. The semiconductor device of claim 16, wherein a third IC device is mounted to the first layer and connected to the third via.

18. The semiconductor device of claim 17, wherein a fourth IC device is mounted to the first layer and connected to a fourth via of the plurality of vias;
  a termination device mounted to the fourth layer; and
  the communication bus further comprises:
    a fourth trace disposed on the third layer and connected to the fourth via and the third via; and
    a fifth trace disposed on the fourth layer and connected to the fourth via and the termination device, and
  wherein the first trace is physically connected to the first via, the second trace is physically connected to the first via and the second via, the third trace is physically connected to the second via and the third via, and the fourth trace is physically connected to the third via and the fourth via.

\* \* \* \* \*